(12) United States Patent
Jang et al.

(10) Patent No.: US 7,803,684 B2
(45) Date of Patent: Sep. 28, 2010

(54) METHOD OF FABRICATING SEMICONDUCTOR DEVICE HAVING A JUNCTION EXTENDED BY A SELECTIVE EPITAXIAL GROWTH (SEG) LAYER

(75) Inventors: Se-myeong Jang, Anyang-si (KR); Woun-suck Yang, Suwon-si (KR); Jae-man Yoon, Seoul (KR); Hyun-ju Sung, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/585,588

(22) Filed: Sep. 18, 2009

(65) Prior Publication Data

US 2010/0015768 A1 Jan. 21, 2010

Related U.S. Application Data

(62) Division of application No. 11/099,603, filed on Apr. 6, 2005, now Pat. No. 7,592,686.

(30) Foreign Application Priority Data

Sep. 10, 2004 (KR) .................. 10-2004-0072475

(51) Int. Cl.
*H01L 21/336* (2006.01)
(52) U.S. Cl. .................. 438/268; 438/213; 438/269; 438/300; 438/607

(58) Field of Classification Search .................. 438/213, 438/269, 300, 607, 268
See application file for complete search history.

(56) References Cited

U.S. PATENT DOCUMENTS

| | | | |
|---|---|---|---|
| 6,475,869 B1 | 11/2002 | Yu | |
| 6,583,469 B1 | 6/2003 | Fried et al. | |
| 6,720,619 B1 | 4/2004 | Chen et al. | |
| 7,300,837 B2 * | 11/2007 | Chen et al. | 438/213 |
| 2004/0097047 A1 | 5/2004 | Natzle et al. | |
| 2004/0121546 A1 | 6/2004 | Yoo | |
| 2004/0150029 A1 | 8/2004 | Lee | |
| 2005/0001216 A1 | 1/2005 | Adkisson et al. | |
| 2005/0040444 A1 * | 2/2005 | Cohen | 257/288 |
| 2005/0242395 A1 | 11/2005 | Chen et al. | |

FOREIGN PATENT DOCUMENTS

JP  2002-198538 A  7/2002

* cited by examiner

*Primary Examiner*—N Drew Richards
*Assistant Examiner*—Jae Lee
(74) *Attorney, Agent, or Firm*—Lee & Morse, P.C.

(57) ABSTRACT

In a semiconductor device, and a method of fabricating the same, the semiconductor device includes a protrusion extending from a substrate and a selective epitaxial growth (SEG) layer surrounding an upper portion of the protrusion, the SEG layer exposing sidewalls of a channel region of the protrusion.

18 Claims, 13 Drawing Sheets

US 7,803,684 B2

METHOD OF FABRICATING SEMICONDUCTOR DEVICE HAVING A JUNCTION EXTENDED BY A SELECTIVE EPITAXIAL GROWTH (SEG) LAYER

CROSS REFERENCE TO RELATED APPLICATION

This is a divisional application based on application Ser. No. 11/099,603, filed Apr. 6, 2005 now U.S. Pat. No. 7,592,686, the entire contents of which is hereby incorporated by reference.

BACKGROUND OF THE INVENTION

1. Field of the Invention

The present invention relates to a semiconductor device and a method of fabricating the same. More particularly, the present invention relates to a semiconductor device having a junction extended by a selective epitaxial growth (SEG) layer and a method of fabricating the same.

2. Description of the Related Art

As semiconductor devices become more highly integrated, a channel length decreases. This decrease causes a short channel effect, requires fine patterns, and slows operating speed. Of these problems, the short channel effect is a particularly serious problem. For example, an increase in an electric field near a drain region leads to a punch-through, i.e., where a drain depletion region penetrates an electric potential barrier near a source region. Also, thermoelectrons cause avalanche, and vertical electric fields deteriorate the mobility of carriers. Further, the short channel effect increases an off current of a transistor, thereby degrading the refresh characteristic of a memory device.

To eliminate the short channel effect, a MOS transistor in which a channel extends vertically from a substrate has been proposed. Such a transistor having an extended channel is called a FinFET. The FinFET includes a greatly extended channel region so that the short channel effect can be notably suppressed.

Generally, as an area of a junction increases, the electric resistance of the junction decreases. With a reduction in the electric resistance, the refresh characteristic of a memory device improves. Also, by reducing a width of a channel interposed between junctions, a threshold voltage is lowered.

However, as the area of a junction increases, the leakage current of the junction also increases. An increase in leakage current deteriorates the refresh characteristic of a memory device. Also, because a conventional FinFET has a small interval between fins, when an insulating isolation layer is filled in the interval, voids are formed in the filled insulating layer. The voids have an adverse effect on the insulation characteristic of the isolation layer. Moreover, the small interval between fins narrows an interval between active regions and further deteriorates the insulation characteristic of the isolation layer.

SUMMARY OF THE INVENTION

The present invention is therefore directed to a semiconductor device having a junction extended by a selective epitaxial growth (SEG) layer and a method of fabricating the same, which substantially overcome one or more of the problems due to the limitations and disadvantages of the related art.

It is a feature of an embodiment of the present invention to provide a semiconductor memory device, in which the area of a junction can be increased without increasing leakage current.

It is another feature of an embodiment of the present invention to provide a semiconductor memory device, in which an insulation characteristic of an isolation layer is enhanced.

It is still another feature of an embodiment of the present invention to provide a method of fabricating the above-described semiconductor memory device.

At least one of the above and other features and advantages of the present invention may be realized by providing a semiconductor device including a protrusion extending from a substrate and a selective epitaxial growth (SEG) layer surrounding an upper portion of the protrusion, the SEG layer exposing sidewalls of a channel region of the protrusion.

A lattice constant of the SEG layer may be similar to a lattice constant of the protrusion.

The SEG layer is one selected from the group including a silicon (Si) layer, a silicon germanium (SiGe) layer, and a combination thereof.

The device may further include a first insulating layer isolating the substrate from the SEG layer. The first insulating layer may be disposed beyond sidewalls of the channel region and recessed to a predetermined depth equal to or greater than a height of the SEG layer. A recessed depth of the first insulating layer from a top surface of the protrusion may be a height of the channel region.

A width of the channel region may be less than a width of an unexposed lower portion of the protrusion.

The device may further include a junction formed by the protrusion and the SEG layer.

At least one of the above and other features and advantages of the present invention may be realized by providing a method of fabricating a semiconductor device having a junction extended by a selective epitaxial growth (SEG) layer, the method including forming a first insulating layer on a semiconductor substrate, the first insulating layer surrounding a protrusion extending vertically from the semiconductor substrate, forming a recessed first insulating layer by recessing the first insulating layer to expose an upper portion of the protrusion, forming the SEG layer surrounding sidewalls of the exposed upper portion of the protrusion on the recessed first insulating layer, etching the SEG layer to expose sidewalls of a channel region of the protrusion where a gate pattern will be formed, and forming the gate pattern on at least one exposed sidewall of the channel region.

Recessing the first insulating layer may include performing a time-controlled wet etching. Recessing the first insulating layer may include using one selected from the group consisting of diluted HF (DHF), $NH_4F$, and buffered oxide etchant (BOE), which is a mixture of HF and deionized water (DIW).

Forming the SEG layer may include performing a molecular beam epitaxy (MBE).

The SEG layer may be one selected from the group including a silicon (Si) layer, a silicon germanium (SiGe) layer, and a combination thereof. Forming the SEG layer may include forming the Si layer using a silicon (Si) source gas selected from the group consisting of $SiH_4$ gas, $SiH_2Cl_2$ gas, $SiCl_4$ gas, and $Si_2H_6$ gas. Forming the SEG layer may include forming the SiGe layer using a silicon (Si) source gas selected from the group including $SiH_4$ gas, $SiH_2Cl_2$ gas, $SiCl_4$ gas, and $Si_2H_6$ gas, and a Ge source gas.

A width of the SEG layer may increase in proportion to a time taken to form the SEG layer.

The method may further include oxidizing a surface of the SEG layer using thermal oxidation.

The method may further include, before etching the SEG layer to expose the sidewalls of the channel region, filling an isolation region including the SEG layer with a second insulating layer and planarizing the second insulating layer until the second insulating layer forms a planar top surface with a top surface of a nitride pattern for a mask on the protrusion. The second insulating layer may form a planar bottom surface with a bottom surface of the SEG layer.

Etching the SEG layer to expose the sidewalls of the channel region may include forming a photoresist pattern defining a recess region where the gate pattern will be formed and sequentially etching the second insulating layer, the SEG layer, and the recessed first insulating layer, which are exposed beyond both sidewalls of the protrusion, using the photoresist pattern as an etch mask. Etching the recessed first insulating layer, the second insulating layer, and the SEG layer may include performing a dry etching.

The method may further include controlling a threshold voltage by reducing a width of the channel region, before forming the gate pattern on at least one sidewall of the channel region. Reducing the width of the channel region may include performing a time-controlled wet etching. Reducing the width of the channel region may include etching lateral surfaces of the channel region using a solution containing diluted HF (DHF) and $NH_4OH$. Reducing the width of the channel region may include using the recessed first insulating layer as an etch stop layer.

BRIEF DESCRIPTION OF THE DRAWINGS

The above and other features and advantages of the present invention will become more apparent to those of ordinary skill in the art by describing in detail exemplary embodiments thereof with reference to the attached drawings in which:

FIGS. 2A through 11A illustrate plan views of stages in a method of fabricating a semiconductor device according to a first embodiment of the present invention;

FIGS. 2B through 11B and 2C through 11C illustrate cross-sectional views of stages in a method of fabricating a semiconductor device according to the first embodiment of the present invention;

DETAILED DESCRIPTION OF THE INVENTION

Figure 1A:
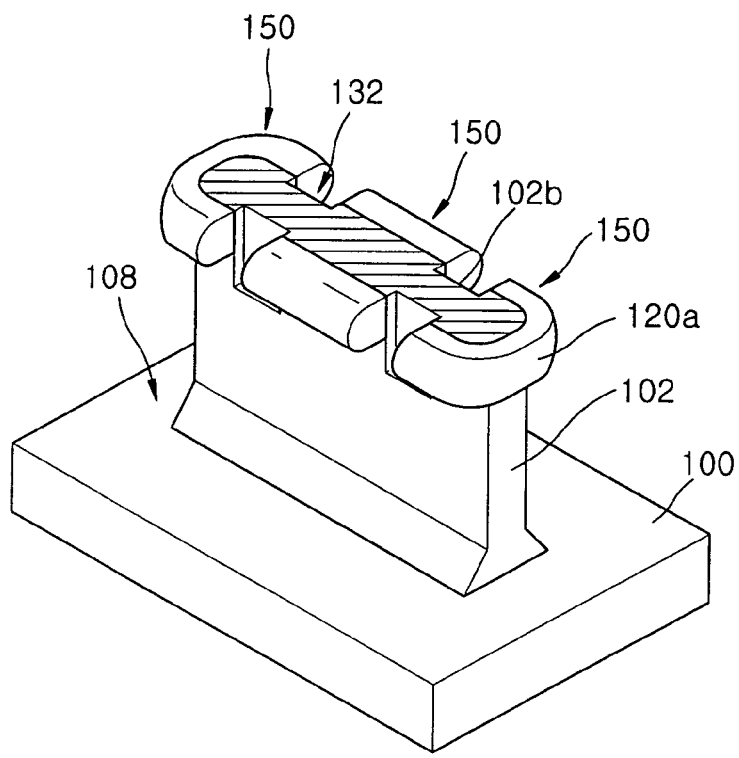
FIG. 1A illustrates a perspective view of a semiconductor device, from which isolation layers are removed, according to an embodiment of the present invention.

Korean Patent Application No. 10-2004-0072475, filed on Sep. 10, 2004, in the Korean Intellectual Property Office, and entitled: "Semiconductor Device Having a Junction Extended by a Selective Epitaxial Growth (SEG) Layer and Method of Fabricating the Same," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of films, layers and regions are exaggerated for clarity of illustration. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

In the embodiments of the present invention, an exemplary triple gate semiconductor device including fin-type active regions will be described.

Figure 1B:
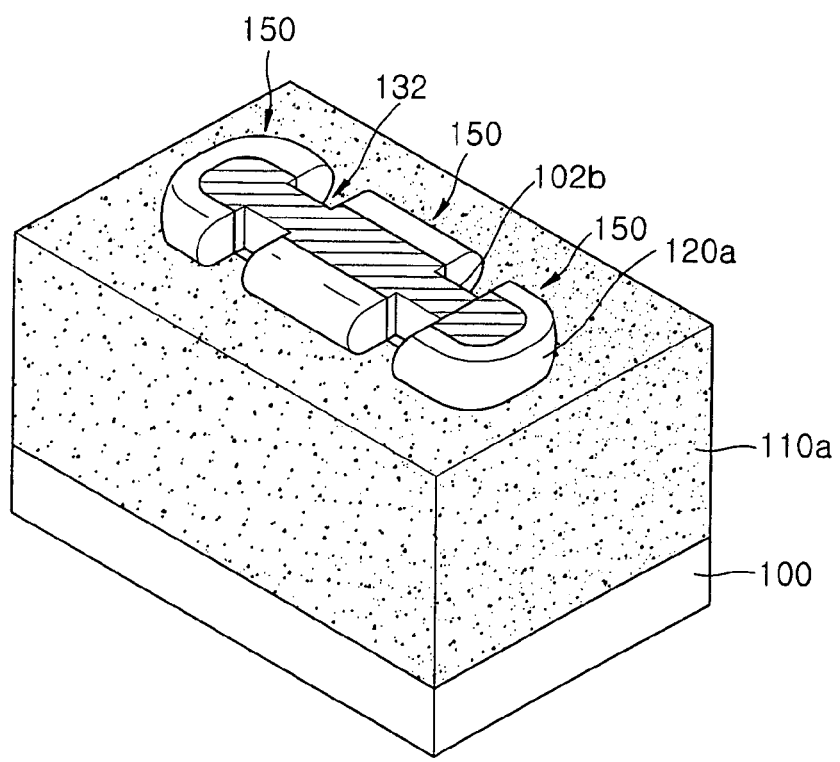
FIG. 1B illustrates a perspective view of a semiconductor device including a first insulating layer, according to an embodiment of the present invention.

FIG. 1A illustrates a perspective view of a semiconductor device, from which isolation layers are removed. FIG. 1B illustrates a perspective view of a semiconductor device having an isolation region 108 filled with a recessed first insulating layer 110a.

Referring to FIGS. 1A and 1B, a fin-type protrusion 102 extends vertically from a semiconductor substrate 100. A selective epitaxial growth (SEG) layer 120a is formed on an upper portion of the protrusion 102. The SEG layer 120a surrounds sidewalls of the protrusion 102 and exposes sidewalls of a channel region 102b where gate patterns will be subsequently formed. The SEG layer 120a may be formed of silicon (Si), silicon germanium (SiGe), or a combination thereof.

The recessed first insulating layer 110a formed in the isolation region 108 of the substrate 100 includes recess regions 132 having a width equal to or greater than a width of the SEG layer 120a that is surface-processed beyond the sidewalls of the channel region 102b. The width of the channel region 102b may be less than that of the unexposed lower portion of the protrusion 102.

In a first embodiment of the present invention, a junction 150 includes the exposed protrusion (102a of FIGS. 4B and 4C, for example) and the SEG layer 120a. Thus, the area of the junction 150 is extended by the SEG layer 120a. As a result, the electric resistance of the junction 150 is reduced so that leakage current can decrease. Meanwhile, since the SEG layer 120a is formed on the recessed first insulating layer 110a, leakage current flowing from the SEG layer 120a to the substrate 100 can be blocked.

First Embodiment

FIGS. 2A through 11A, 2B through 11B, and 2C through 11C illustrate stages in a method of fabricating a semiconductor device according to a first embodiment of the present invention.

Figure 2A:
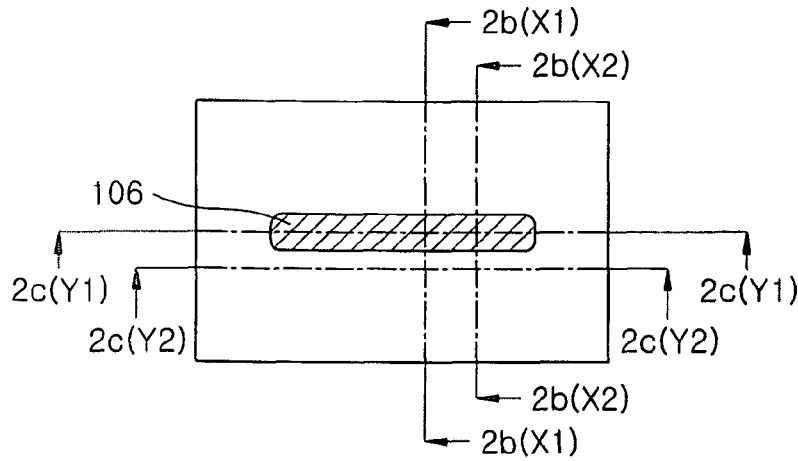
Figure 2B:
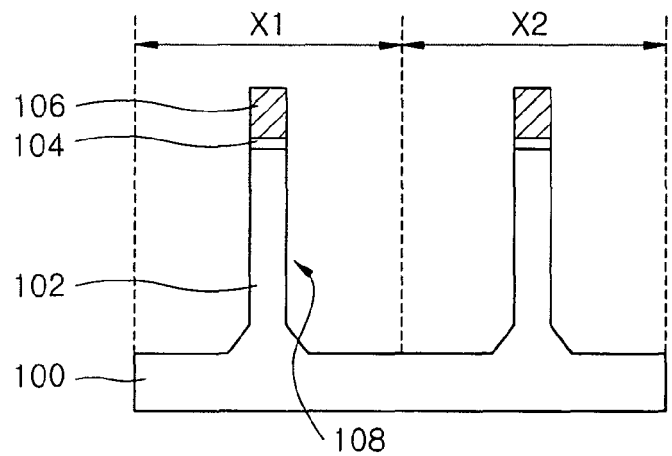
Figure 2C:
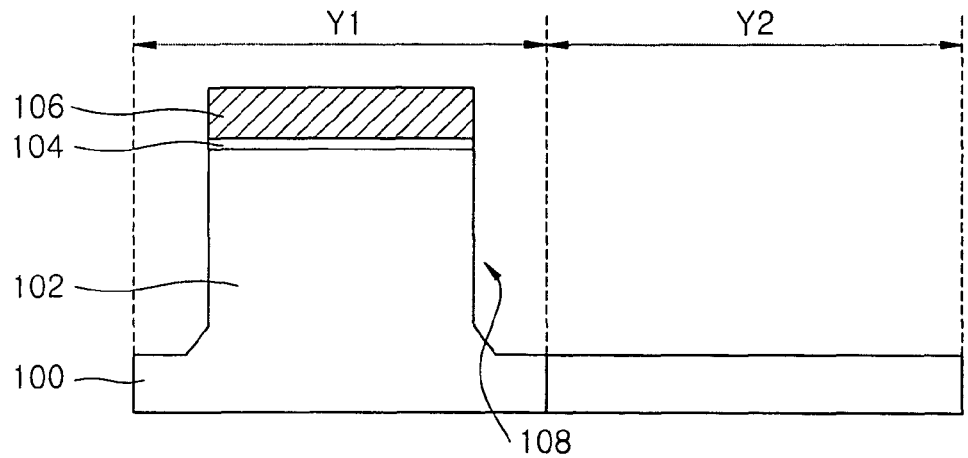

FIG. 2A illustrates a plan view of a structure in which the protrusion 102 extends vertically from the semiconductor substrate 100. FIG. 2B illustrates cross-sectional views taken along x-axial lines 2b(X1) and 2b(X2) shown in FIG. 2A. FIG. 2C illustrates cross-sectional views taken along y-axial lines 2c(Y1) and 2c(Y2) shown in FIG. 2A.

Referring to FIGS. 2A through 2C, a pad oxide layer (not shown) and a nitride layer (not shown) for a mask are sequentially stacked on the semiconductor substrate 100. The pad oxide layer reduces stress between the substrate 100 and the nitride layer and is deposited to a thickness of about 20 to about 200 Å, preferably about 100 Å. The nitride layer is used as a hard mask during an etch process for forming a shallow trench isolation (STI) region and deposited to a thickness of about 500 to about 2000 Å, preferably about 800 to about 850 Å. The nitride layer may be deposited using a known method, e.g., chemical vapor deposition (CVD), sub-atmospheric CVD (SACVD), low-pressure CVD (LPCVD), or plasma-enhanced CVD (PECVD).

A first photoresist pattern (not shown) is formed on the nitride layer for the mask and defines the protrusion 102, which extends vertically from the substrate 100. Thereafter, by removing a portion of the semiconductor substrate 100 using the first photoresist pattern as an etch mask, a nitride pattern 106 for a mask and a pad oxide pattern 104 are formed. Further, the isolation region 108, which surrounds the protrusion 102, is formed on the semiconductor substrate 100. The first photoresist pattern is then removed using a known method. For instance, the first photoresist pattern may be ashed using $O_2$-containing plasma and removed using organic stripping. In this case, the isolation region 108 is formed to a sufficient depth for isolation, e.g., to a depth of about 3000 to about 5000 Å. The protrusion 102 may have a rectangular section, rounded upper edges, or a cylindrical shape.

A sidewall oxide layer (not shown) may be further formed using thermal oxidation on inner surfaces of the exposed isolation region 108 and the sidewalls of the pad oxide pattern 104. The sidewall oxide layer is formed to such a sufficient thickness as to minimize remaining stress, e.g., to a thickness of preferably about 10 to about 150 Å, more preferably about 80 to about 120 Å. A nitride liner (not shown) may be further deposited on the sidewall oxide layer. The nitride liner may be conformally formed along the inner surface of the isolation region 108 and have a thickness of about 50 to about 300 Å.

Figure 3A:
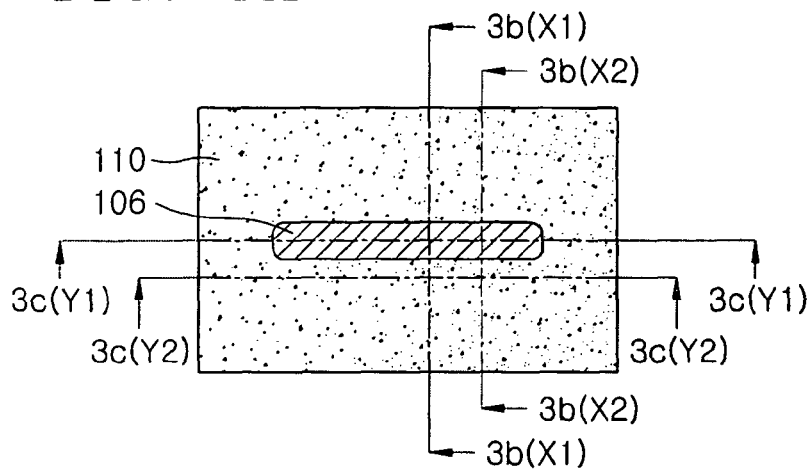
Figure 3B:
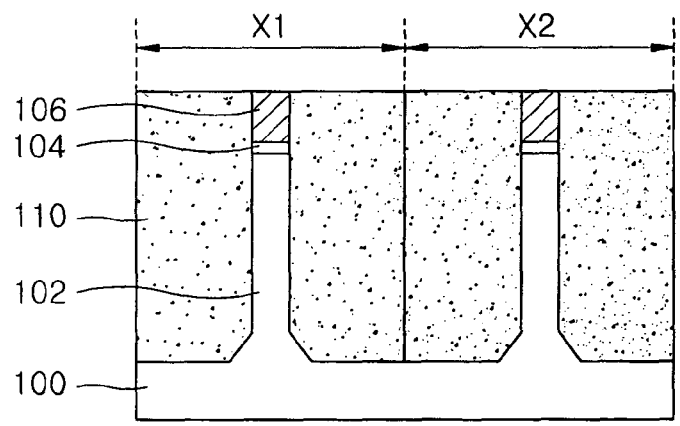
Figure 3C:
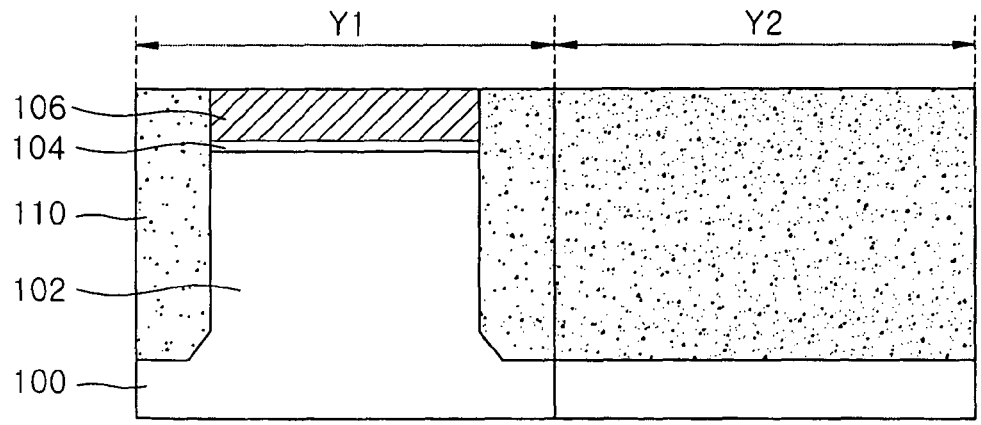

FIG. 3A illustrates a plan view of a structure after the isolation region 108 is filled with a first insulating layer 110. FIG. 3B illustrates cross-sectional views taken along x-axial lines 3b(X1) and 3b(X2) shown in FIG. 3A. FIG. 3C illustrates cross-sectional views taken along y-axial lines 3c(Y1) and 3c(Y2) shown in FIG. 3A.

Referring to FIGS. 3A through 3C, the isolation region 108 of the substrate 100 is filled with the first insulating layer 110 for isolation, e.g., an oxide layer. Thus, lateral surfaces of the protrusion 102, the pad oxide pattern 104, and the nitride pattern 106 for the mask are surrounded by the first insulating layer 110. The first insulating layer 110 may be one selected from the group consisting of a USG layer, an HDP oxide layer, a TEOS layer formed using PECVD, an oxide layer formed using PECVD, and a combination thereof. Among these, a dense HDP oxide layer is most suitable for filling the isolation region 108. An HDP-CVD process is a combination of a chemical vapor deposition (CVD) process and an etch process using sputtering. During the HDP-CVD process, a deposition gas required for depositing a material layer and a sputtering gas required for etching the material layer using sputtering are supplied to a reaction chamber. For example, silane ($SiH_4$) and oxygen ($O_2$) may be supplied as the deposition gas, and an inert gas, e.g., argon (Ar) gas, may be supplied as the sputtering gas. The deposition gas and the sputtering gas are partially ionized due to plasma that is induced in the chamber by high-frequency power. Meanwhile, because biased high-frequency power is applied to a wafer chuck, e.g., an electrostatic chuck (ESC), installed in the chamber in which the substrate 100 is loaded, the ionized deposition gas and sputtering gas are accelerated toward a surface of the substrate 100. The accelerated ions of the deposition gas form a silicon oxide layer, and the accelerated ions of the sputtering gas are used to sputter the deposited silicon oxide layer. By undergoing the above-described processes, the first insulating layer 110 formed of HDP oxide becomes dense and has an excellent gap filling characteristic. After forming the first insulating layer 110, the first insulating layer 110 is planarized until the nitride pattern 106 for the mask is exposed.

Figure 4A:
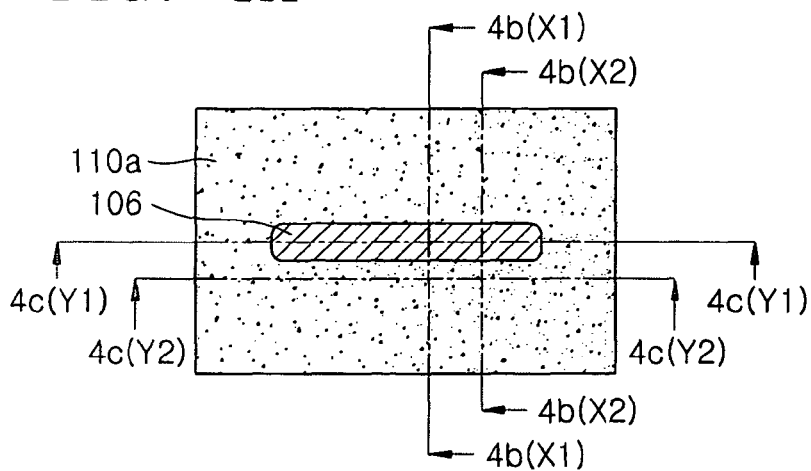
Figure 4B:
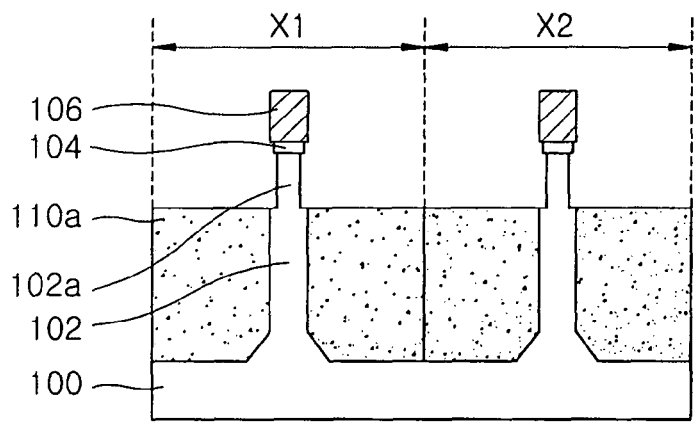
Figure 4C:
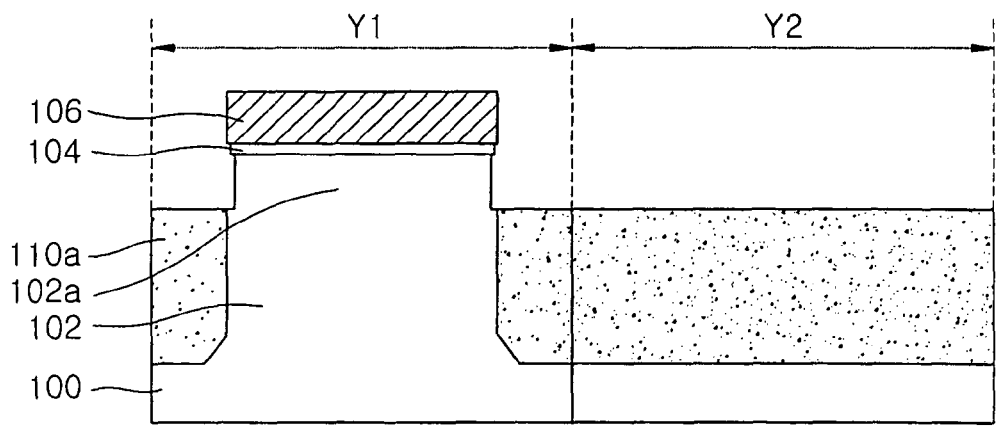

FIG. 4A illustrates a plan view of a structure after the recessed first insulating layer 110a filled in the isolation region 108 is recessed to a predetermined depth. FIG. 4B illustrates cross-sectional views taken along x-axial lines 4b(X1) and 4b(X2) shown in FIG. 4A. FIG. 4C illustrates cross-sectional views taken along y-axial lines 4c(Y1) and 4c(Y2) shown in FIG. 4A.

Referring to FIGS. 4A through 4C, using the nitride pattern 106 as an etch mask, the first insulating layer 110 is etched, i.e., recessed, to a predetermined depth to expose sidewalls of an upper portion of the protrusion 102, thereby resulting in the recessed first insulating layer 110a. The first insulating layer 110 may be etched by time-controlled wet etching using diluted HF (DHF), $NH_4F$, or buffered oxide etchant (BOE), which is a mixture of HF and deionized water (DIW).

The first insulating layer 110, the sidewall oxide layer, and the nitride liner are etched considering etch selectivities therebetween. That is, the nitride liner is removed using an etchant containing phosphoric acid. A height of the SEG layer (120 of FIGS. 5A through 5C, for example) is determined by the recessed amount of the first insulating layer 110 and may be, e.g., about 500 to about 1500 Å. After the etching of the first insulating layer 110, the pad oxide pattern 104 has undercuts. The exposed protrusion 102a, disposed under the pad oxide pattern 104 having the undercuts, is etched using an etchant containing HF and $NH_4OH$ and thus, has a reduced width.

Figure 5A:
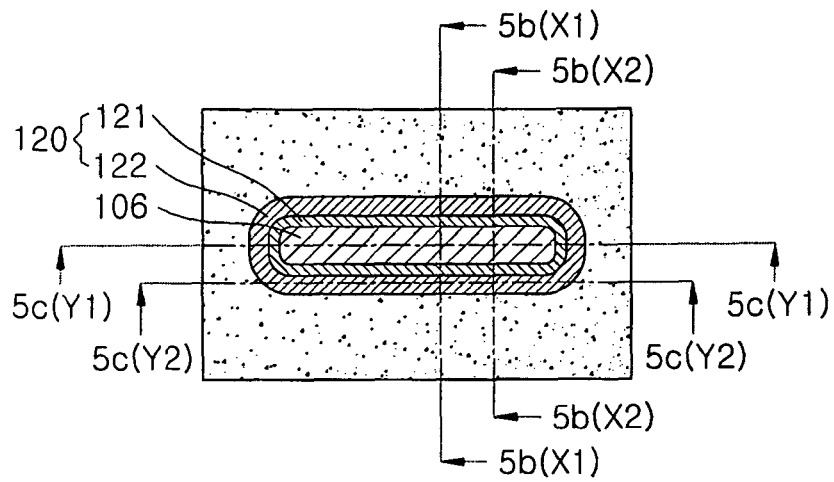
Figure 5B:
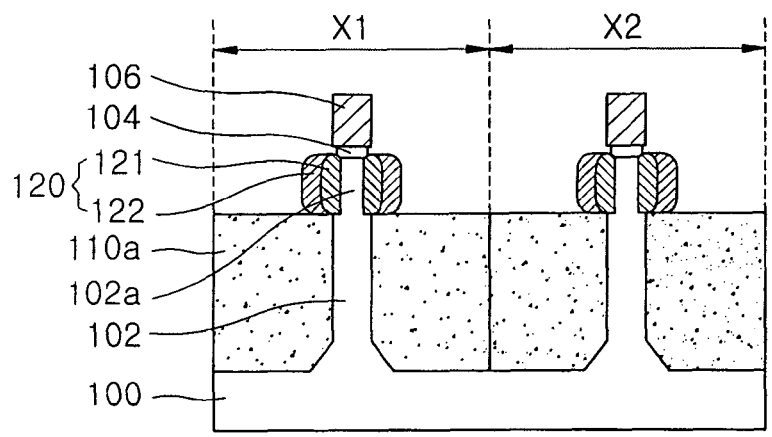
Figure 5C:
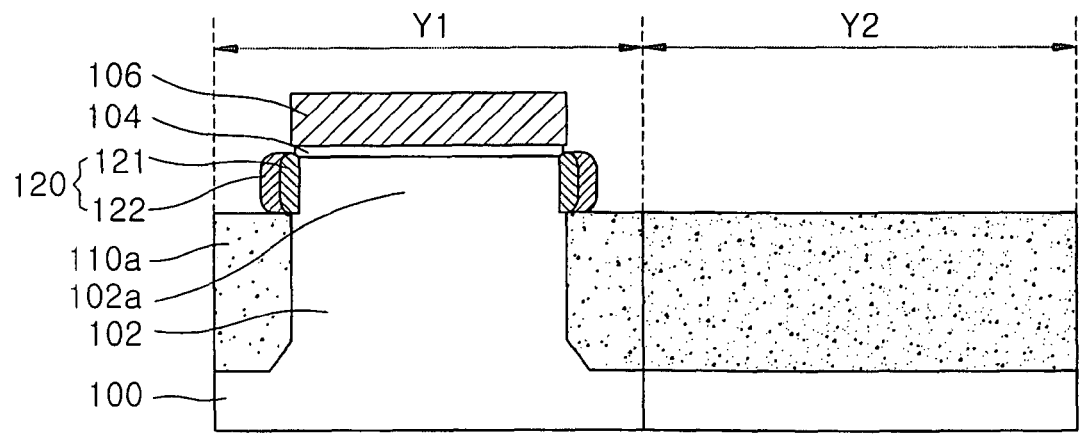

FIG. 5A illustrates a plan view of a structure after the SEG layer 120 is formed on sidewalls of the exposed protrusion 102a. FIG. 5B illustrates cross-sectional views taken along x-axial lines 5b(X1) and 5b(X2) shown in FIG. 5A. FIG. 5C illustrates cross-sectional views taken along y-axial lines 5c(Y1) and 5c(Y2) shown in FIG. 5A.

Referring to FIGS. 5A through 5C, the SEG layer 120 is formed on sidewalls of the exposed protrusion 102a. The SEG layer 120 may be formed of Si, SiGe, or a combination thereof. For example, the SEG layer 120 may be a Si layer, a SiGe layer, a Si/SiGe layer, a SiGe/Si layer, or a Si/SiGe/Si layer. Because a SiGe layer greatly increases the mobility of carriers, in the first embodiment of the present invention, the SEG layer 120 includes a SiGe layer 121 and a Si layer 122, which are sequentially stacked. The SEG layer 120 may be formed of a material having a similar lattice constant to the protrusion 102. The SEG layer 120 may be treated using $H_2$-annealing to remove defects, if required.

The SEG layer 120 may be formed using molecular beam epitaxy (MBE). The Si layer 122 may be grown using a Si source gas, e.g., $SiH_4$ gas, $SiH_2Cl_2$ gas, $SiCl_4$ gas, or $Si_2H_6$ gas. The SiGe layer 121 may be grown using a Si source gas, e.g., $SiH_4$ gas, $SiH_2Cl_2$ gas, $SiCl_4$ gas, or $Si_2H_6$ gas, and a Ge source gas, e.g., $GeH_4$ gas. In the first embodiment of the present invention, the SiGe layer 121 is deposited on the sidewalls of the exposed protrusion 102a. Thereafter, the Si layer 122 is grown from the lateral surfaces of the SiGe layer 121.

The height of the SEG layer 120 depends on the etched amount of the recessed first insulating layer 110a. The recessed first insulating layer 110a prevents the SEG layer 120 from growing downward. A width of the SEG layer 120 increases in proportion to a time taken to deposit the SEG layer 120. Accordingly, the deposition time can be appropriately controlled to obtain a desired width of the SEG layer 120.

Figure 6A:
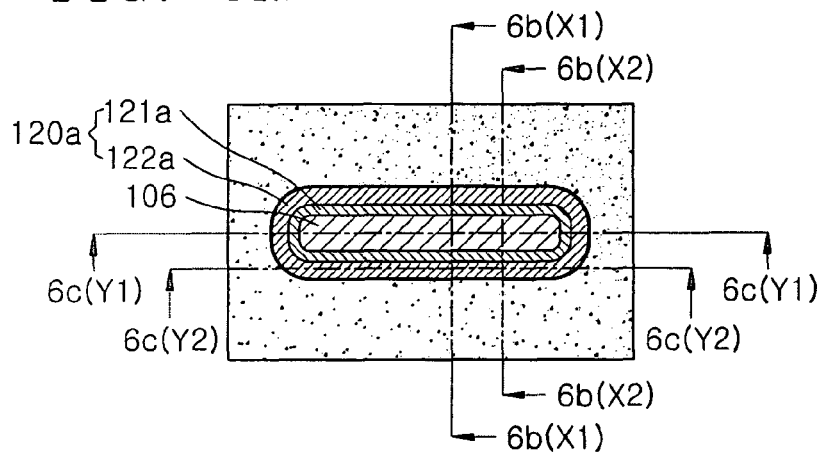
Figure 6B:
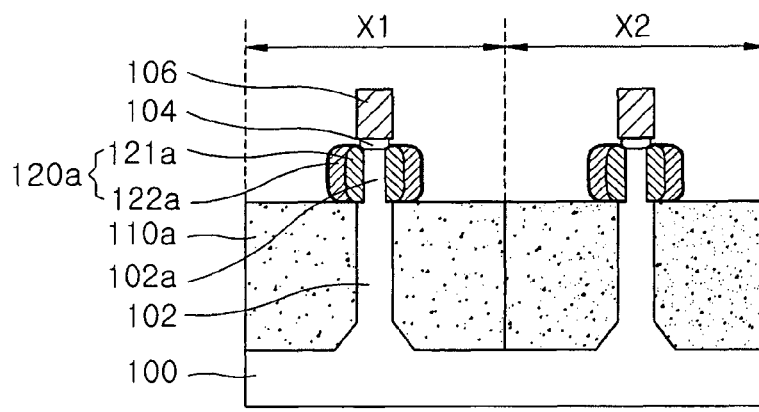
Figure 6C:
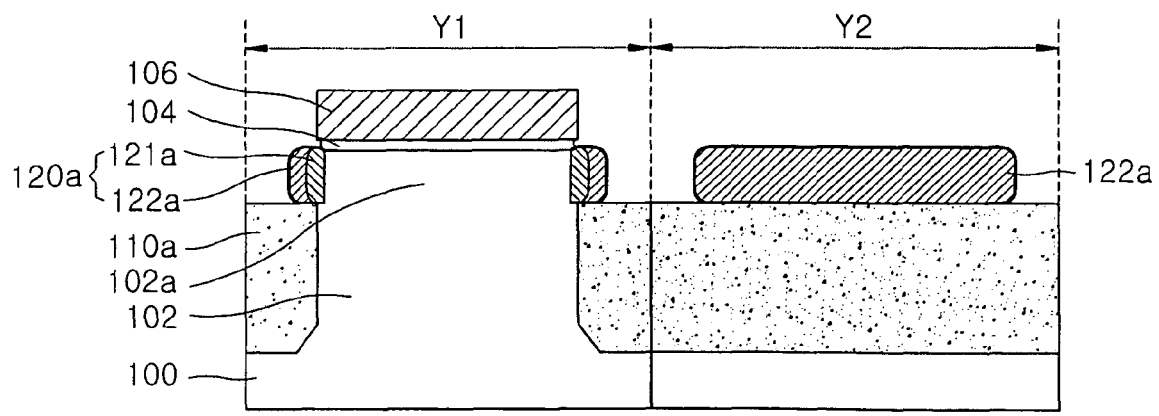

FIG. 6A illustrates a plan view of a structure after the surface of the SEG layer 120 is oxidized. FIG. 6B illustrates cross-sectional views taken along x-axial lines 6b(X1) and 6b(X2) shown in FIG. 6A. FIG. 6C illustrates cross-sectional views taken along y-axial lines 6c(Y1) and 6c(Y2) shown in FIG. 6A.

Referring to FIGS. 6A through 6C, the surface of the SEG layer 120 is processed, thereby forming a surface-processed SEG layer 120a, a surface-processed SiGe layer 121a and a surface-processed Si layer 122a. The surface-processed SEG layer 120a may be formed using thermal oxidation. While the surface of the SEG layer 120 is being processed, defects generated during the formation of the SEG layer 120 can be eliminated due to applied heat. In this case, the surface-processing of the SEG layer 120 may be performed in an $O_2$ atmosphere at a temperature of about 700 to about 900° C.

Figure 7A:
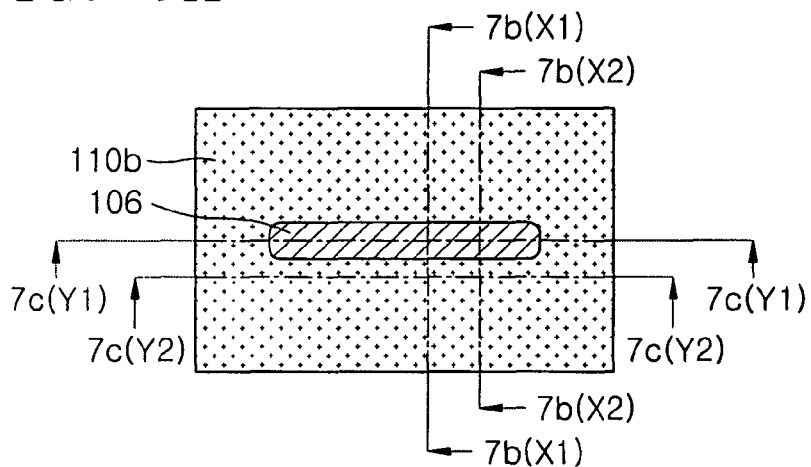
Figure 7B:
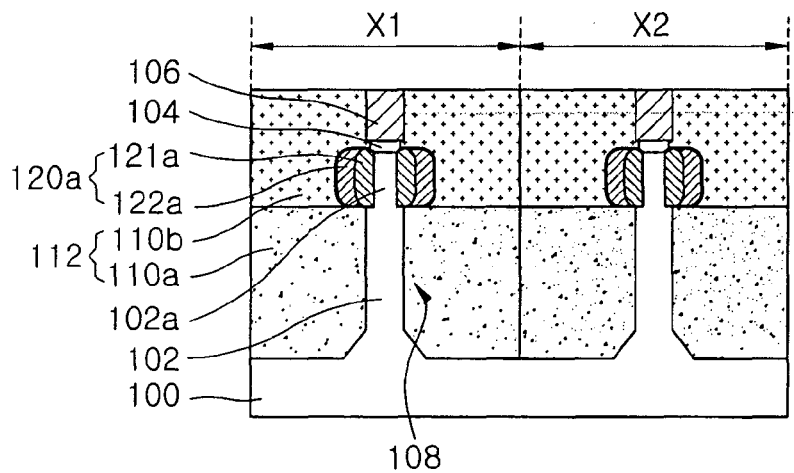
Figure 7C:
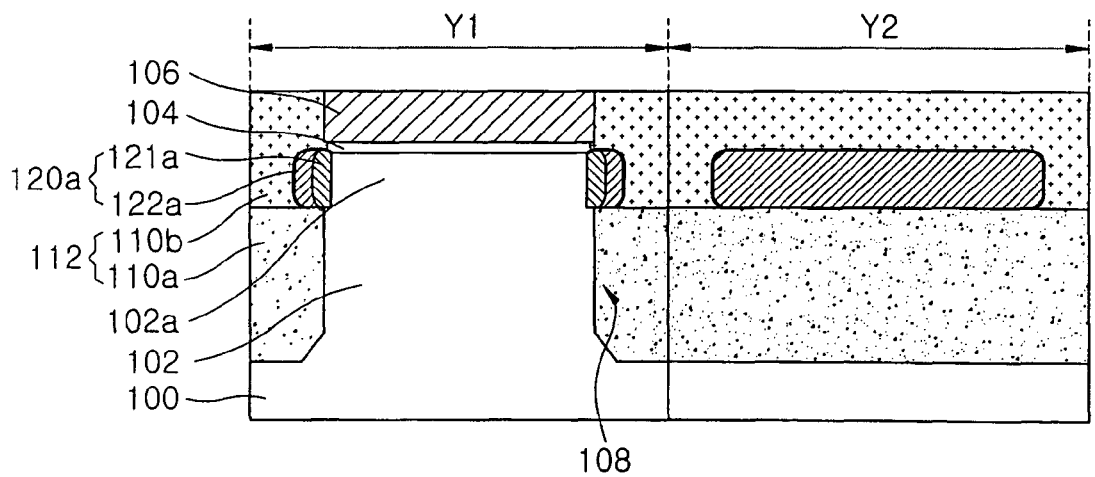

FIG. 7A illustrates a plan view of a structure after an isolation layer 112 is formed. FIG. 7B illustrates cross-sectional views taken along x-axial lines 7b(X1) and 7b(X2) shown in FIG. 7A. FIG. 7C illustrates cross-sectional views taken along y-axial lines 7c(Y1) and 7c(Y2) shown in FIG. 7A.

Referring to FIGS. 7A through 7C, a second insulating layer 110b, e.g., an oxide layer, is filled on the recessed first insulating layer 110a of the isolation region 108 including the surface-processed SEG layer 120a, in the same manner as described with reference to FIG. 3. Then, the second insulating layer 110b is planarized until the nitride pattern 106 for the mask is exposed. Thus, the isolation layer 112 including the first recessed and second insulating layers 110a and 110b is formed.

In the first embodiment, the isolation layer 112 may have a wider gap filled region than a conventional isolation layer. Since the recessed first insulating layer 110a disposed under the SEG layer 120a is used as a portion of the isolation layer 112, the gap filled isolation region is extended by the width of the SEG layer 120a. Therefore, the extended gap filled region minimizes voids, which may be generated during the filling of the recessed first insulating layer 110a.

The second insulating layer 110b may only be about 1500 Å thick, so that even a narrow space can be sufficiently filled without defects, such as voids. That is, active regions can be completely isolated by the second insulating layer 110b. As a result, an interval between the active regions can be minimized, thereby improving the integration density of semiconductor devices.

Figure 8A:
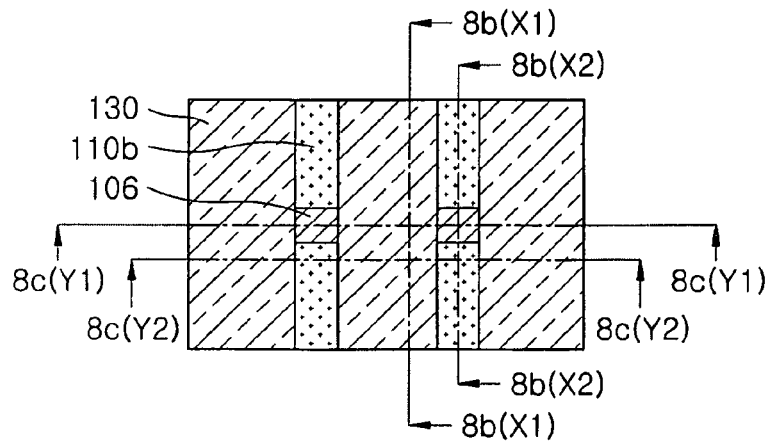
Figure 8B:
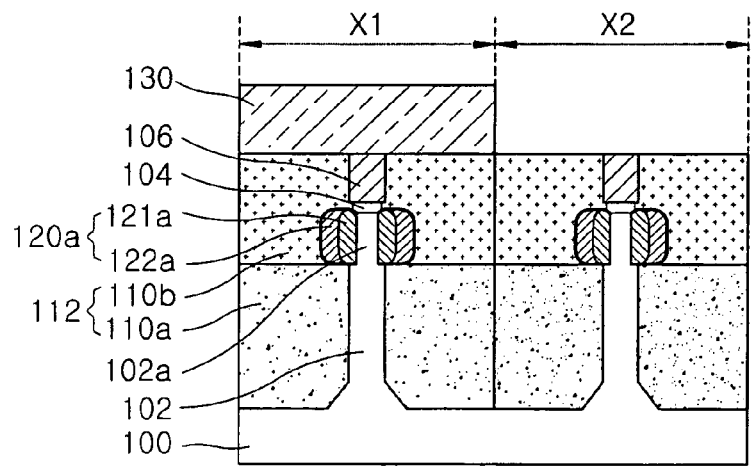
Figure 8C:
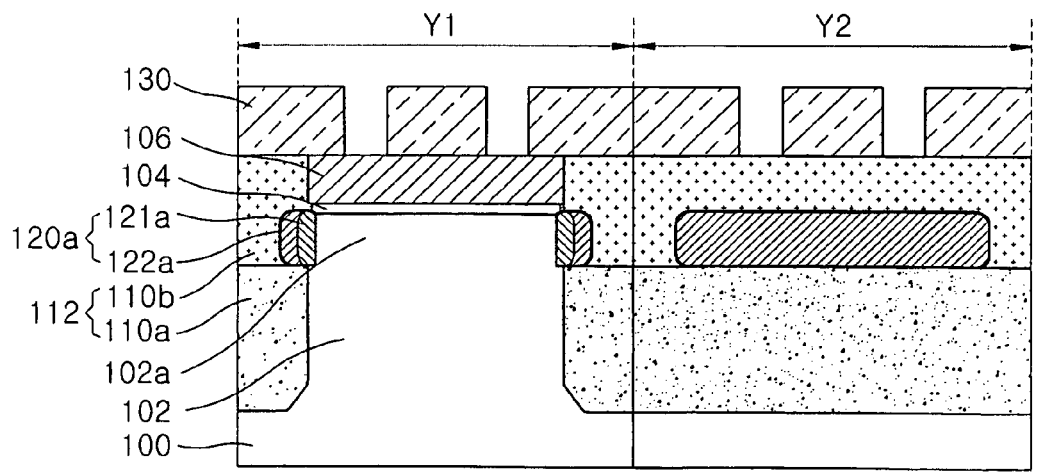

FIG. 8A illustrates a plan view of a structure after a second photoresist pattern 130 is formed to define a recess region in which a gate pattern (144 of FIG. 12) will be formed. FIG. 8B illustrates cross-sectional views taken along x-axial lines 8b(X1) and 8b(X2) shown in FIG. 8A. FIG. 8C illustrates cross-sectional views taken along y-axial lines 8c(Y1) and 8c(Y2) shown in FIG. 8A.

Referring to FIGS. 8A through 8C, the photoresist pattern 130 is formed on the isolation layer 112 to define the gate pattern. The second photoresist pattern 130 is required to form the gate pattern of a FinFET using a damascene process.

Figure 9A:
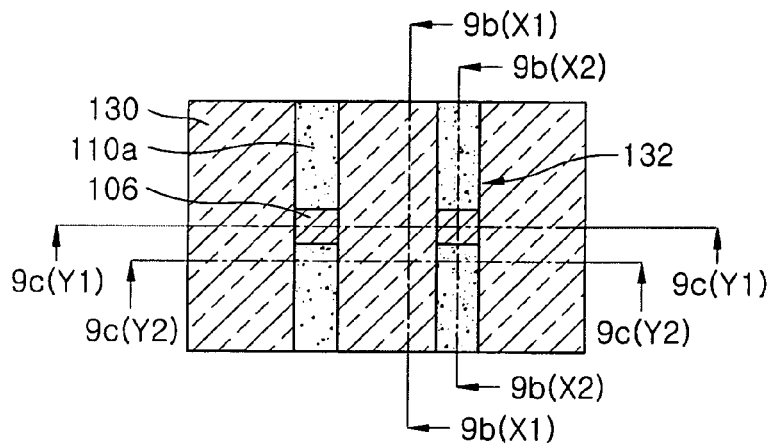
Figure 9B:
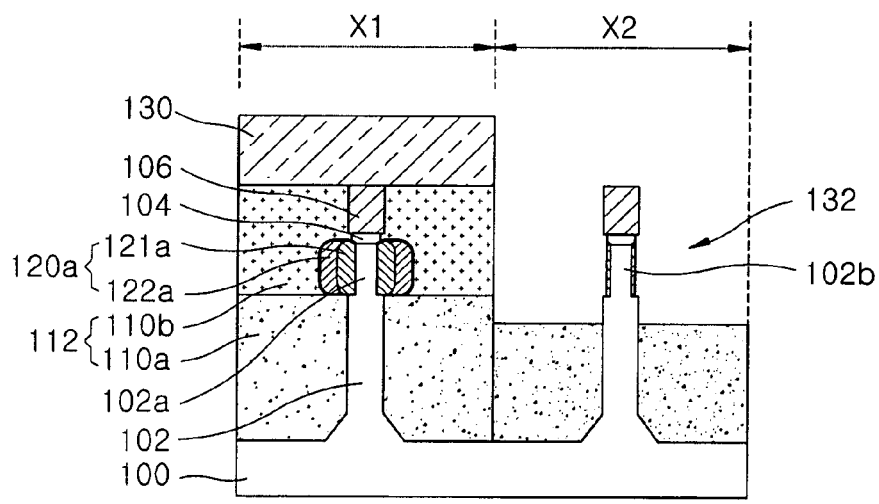
Figure 9C:
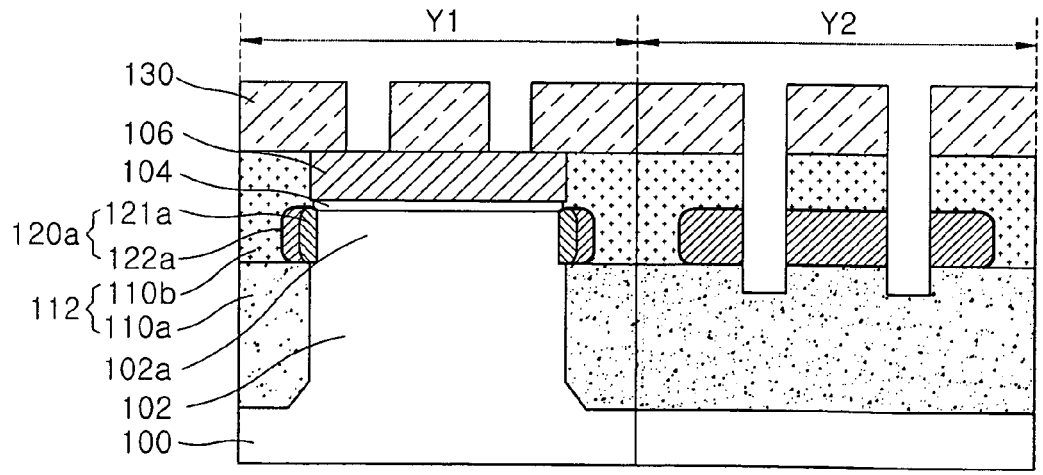

FIG. 9A illustrates a plan view of a structure after a recess region 132, i.e., where the gate pattern will be formed, is formed. FIG. 9B illustrates cross-sectional views taken along x-axial lines 9b(X1) and 9b(X2) shown in FIG. 9A. FIG. 9C illustrates cross-sectional views taken along y-axial lines 9c(Y1) and 9c(Y2) shown in FIG. 9A.

Referring to FIGS. 9A through 9C, the second insulating layer 110b, the SEG layer 120a, and the recessed first insulating layer 110a, which are disposed in a lower portion beyond both sidewalls of the protrusion 102, are sequentially etched along the form of the protrusion 102 using the second photoresist pattern 130 as an etch mask. Thus, the recess region 132 is formed in a lower portion beyond both sidewalls of the protrusion 102.

The recess region 132 may be formed using dry etching, e.g., plasma etching or reactive ion beam etch (RIE). In this case, conditions for etching can be appropriately controlled such that the recessed first insulating layer 110a, the second insulating layer 110b, and the SEG layer 120a have almost the same etch rate.

The etched depth of the first recessed insulating layer 110a determines the width of a channel of the semiconductor device of the present embodiment. If the etched depth of the recessed first insulating layer 110a is excessively large, since a depth of the recess region 132 increases during a subsequent process, an isolation characteristic of the isolation layer is degraded. Therefore, the depth of the recess region 132 is appropriately determined considering the isolation characteristic and the width of the channel. In the recess region 132 of the exposed protrusion 102a, the channel region 102b is formed.

Figure 10A:
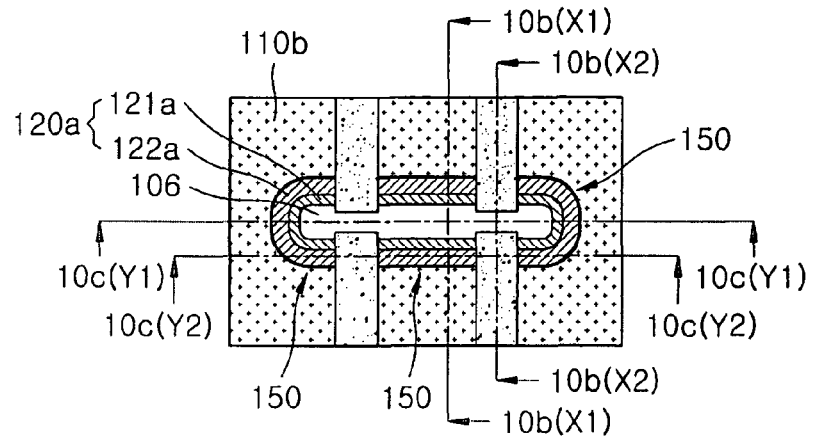
Figure 10B:
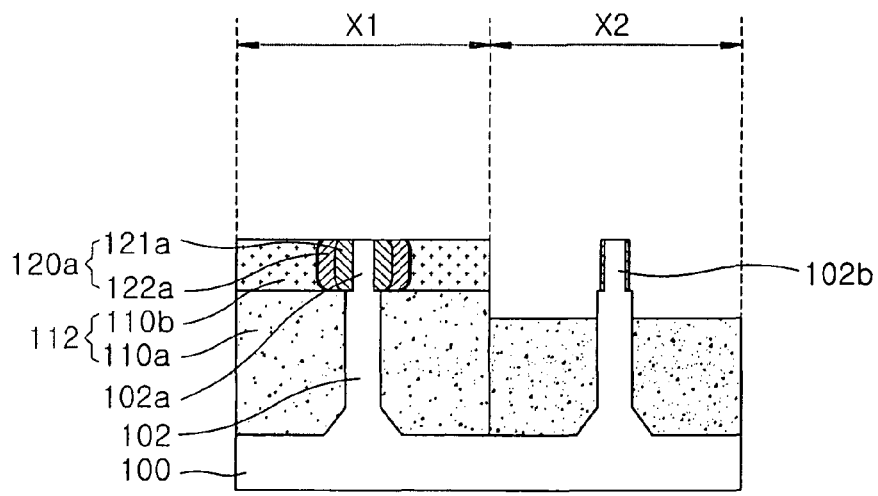
Figure 10C:
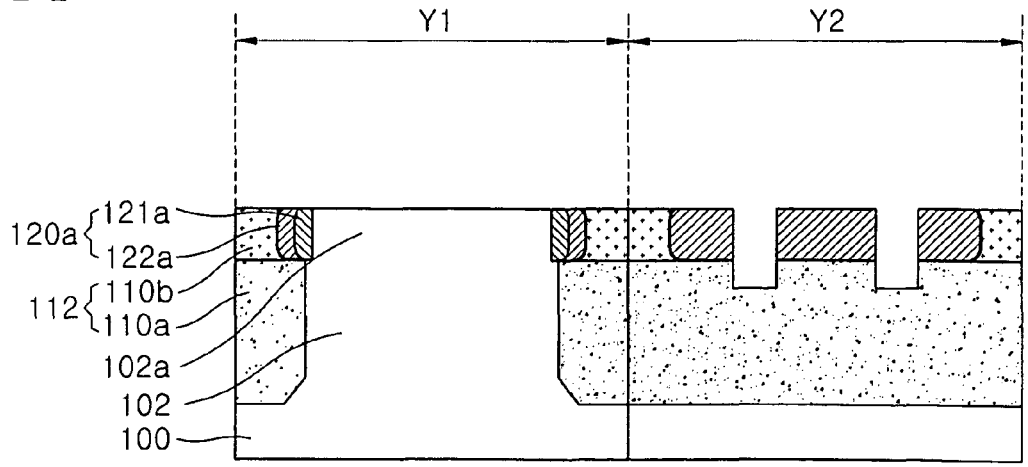

FIG. 10A illustrates a plan view of a structure after a planarization process is performed until the SEG layer 120a is exposed. FIG. 10B illustrates cross-sectional views taken along x-axial lines 10b(X1) and 10b(X2) shown in FIG. 10A. FIG. 10C illustrates cross-sectional views taken along y-axial lines 10c(Y1) and 10c(Y2) shown in FIG. 10A.

Referring to FIGS. 10A through 10C, the pad oxide pattern 104, the nitride pattern 106 for the mask, and the second insulating layer 110b are planarized until a planar surface with a top surface of the SEG layer 120a is formed. The nitride pattern 106 for the mask may be removed using phosphoric acid, and the pad oxide pattern 104 and the second insulating layer 110b may be removed using DHF, $NH_4F$, or BOE, which is a mixture of HF and DIW. Once the planarization process is finished, the junction 150 including the exposed protrusion 102a and the SEG layer 120a is exposed.

In some cases, the planarization process may be conducted using chemical mechanical polishing (CMP) or an etchback process. The CMP or etchback process may be used after the recess region 132 is filled with an insulating layer.

Figure 11A:
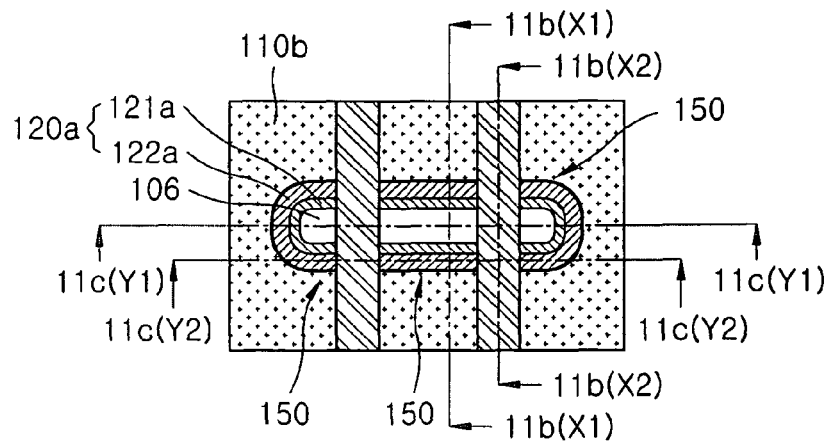
Figure 11B:
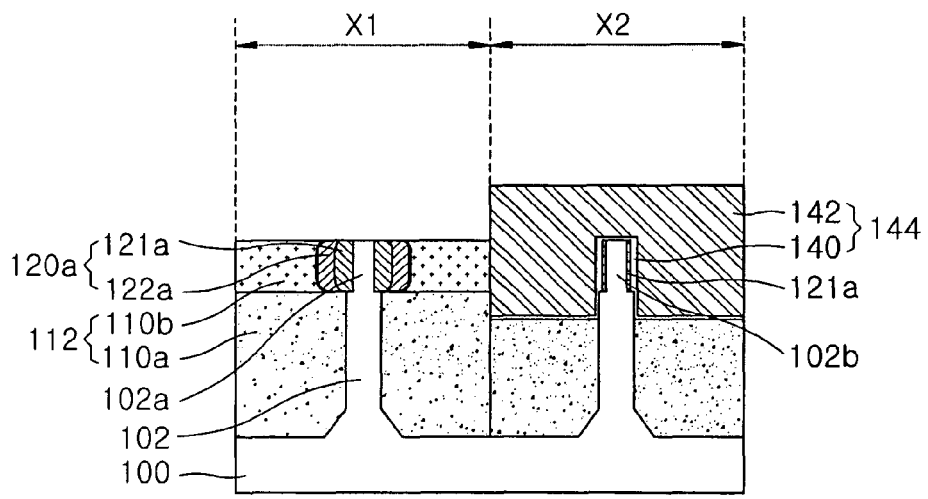
Figure 11C:
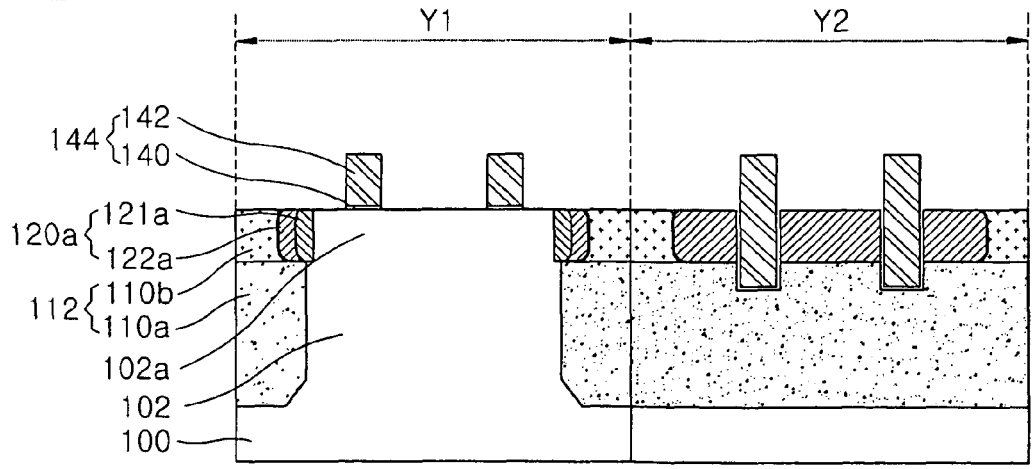

FIG. 11A illustrates a plan view of a structure after a gate electrode pattern 144 is formed on both sidewalls and a top surface of the channel region 102b. FIG. 11B illustrates cross-sectional views taken along x-axial lines 11b(X1) and 11b(X2) shown in FIG. 11A. FIG. 11C illustrates cross-sectional views taken along y-axial lines 11c(Y1) and 11c(Y2) shown in FIG. 11A.

Referring to FIGS. 11A through 11C, a gate insulating layer 140 is formed on inner surface of the recess region 132 and surfaces of the channel region 102b, which have undergone the planarization process. The gate insulating layer 140 may be formed using thermal oxidation and may be a thermal oxide layer or a high-k insulating layer, e.g., any one of an oxide layer, an ONO layer, and a high-k material layer.

Thereafter, a gate conductive pattern 142 is deposited on an entire surface of the substrate 100 having the gate insulating layer 140, thereby forming the gate electrode pattern 144. The gate electrode pattern 144 covers at least one lateral surface of the channel region 102b. In the exemplary triple gate semiconductor device of the first embodiment, the gate electrode pattern 144 covers both lateral surfaces and the top surface of the channel region 102b. The gate conductive pattern 142 may be formed of at least one selected from the group consisting of amorphous polysilicon, doped polysilicon, poly-SiGe, and a material containing a conductive metal. The material containing the conductive metal may be at least one selected from the group consisting of metals, such as tungsten and molybdenum, and conductive metal nitrides, such as titanium nitride, tantalum nitride, and tungsten nitride.

Second Embodiment

Figure 12A:
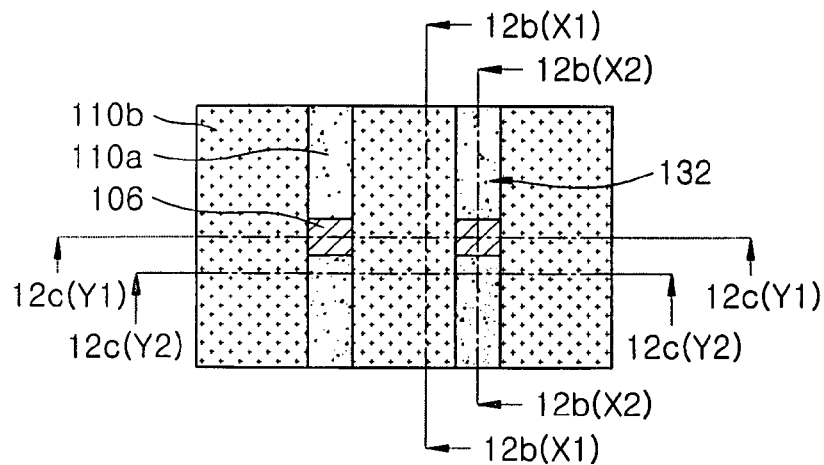
FIGS. 12A and 13A illustrate plan views of stages in a method of fabricating a semiconductor device according to a second embodiment of the present invention.
Figure 12B:
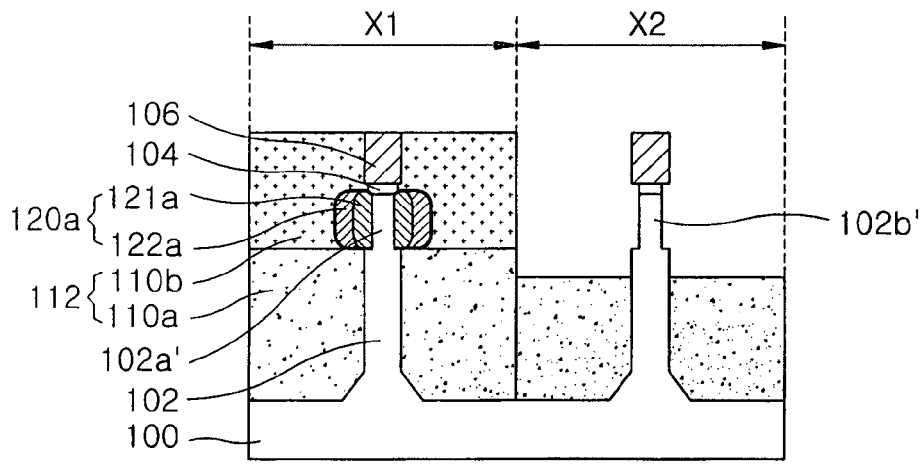
FIGS. 12B, 12C, 13B, and 13C illustrate cross-sectional views of stages in a method of fabricating a semiconductor device according to the second embodiment of the present invention.
Figure 12C:
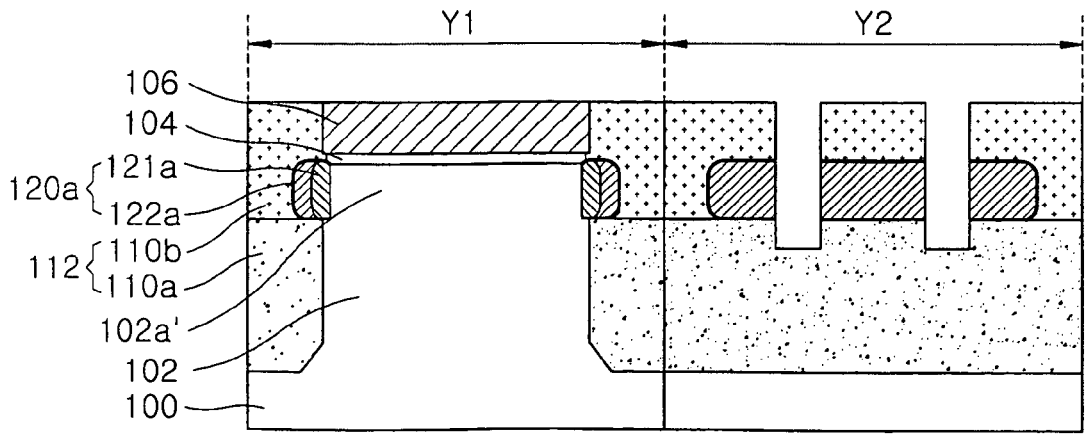

FIG. 12A illustrates a plan view of a structure after a width of an exposed protrusion 102a' is reduced. FIG. 12B illustrates cross-sectional views taken along x-axial lines 12b(X1) and 12b(X2) shown in FIG. 12A. FIG. 12C illustrates cross-sectional views taken along y-axial lines 12c(Y1) and 12c(Y2) shown in FIG. 12A. In the second embodiment, a process of exposing the protrusion 102a' is performed in the same manner as described in the first embodiment with reference to FIGS. 2A through 9A, 2B through 9B, and 2C through 9C.

The width of the exposed protrusion 102a' may be reduced in order to control threshold voltage. Generally, a reduction in the width of the top surface of a channel region leads to a decrease in threshold voltage. If the width of the top surface of the channel region is greatly reduced and thus, the channel region is fully depleted, a threshold voltage is significantly reduced, e.g., to about one volt. Accordingly, if the threshold voltage does not require reduction, the width of the top surface of the channel region may not be narrowed. FIGS. 12A through 12C illustrate a case where a threshold voltage needs to be controlled by reducing the width of the exposed protrusion 102a'.

Referring to FIGS. 12A through 12C, sidewalls of the exposed protrusion 102a' disposed in the recess region 132 are etched to a predetermined thickness using the nitride pattern 106 for a mask as an etch mask, thereby forming a channel region 102b'. In this case, the time-controlled wet etching may be performed using a wet etchant, e.g., a solution containing HF and NH$_4$OH, and using the recessed first insulating layer 110a as an etch stop layer. As a result, the channel region 102b' disposed in the recess region 132 has a reduced width.

In the second embodiment, the exposed protrusion 102a' is reduced to a different width than described with reference to FIGS. 4A through 4C. More specifically, in the first embodiment, the exposed protrusion 102a is narrowed to such a width that allows a desired SEG layer 120a to be formed on the surface of the channel region 102b. However, in the second embodiment, the exposed protrusion 102a' may be narrowed to a much larger width in order to control the threshold voltage.

Figure 13A:
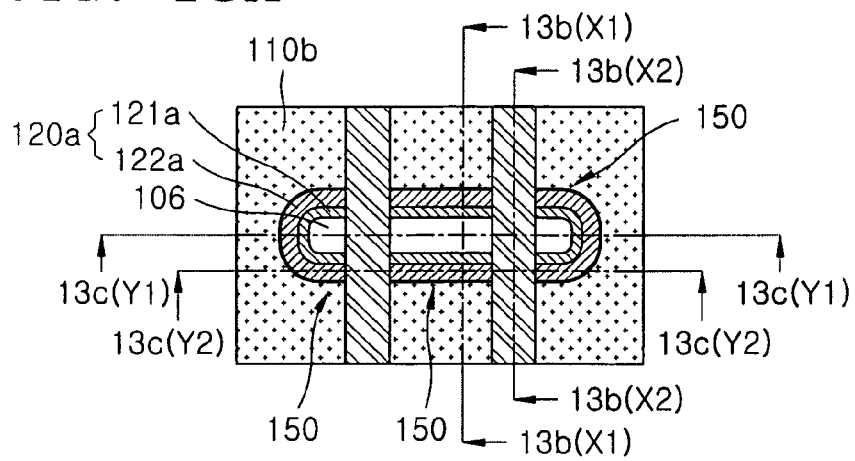
Figure 13B:
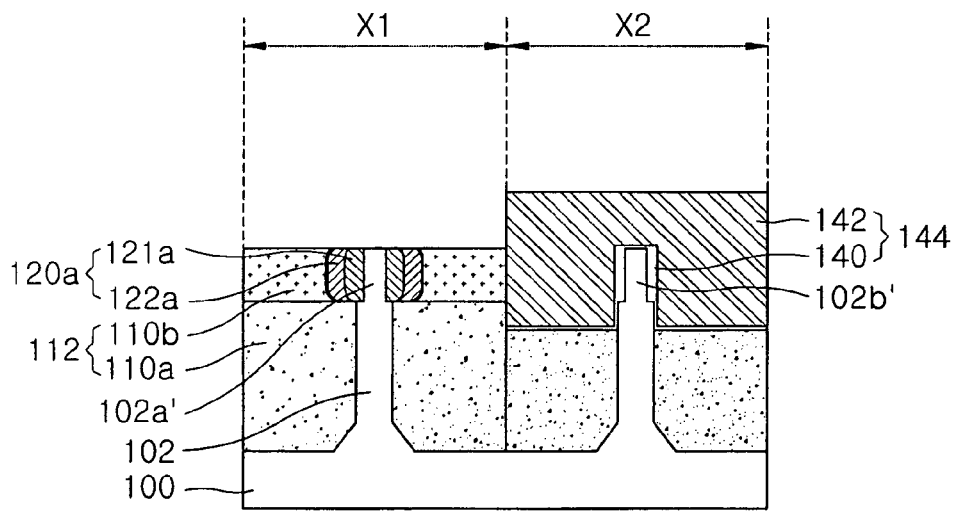
Figure 13C:
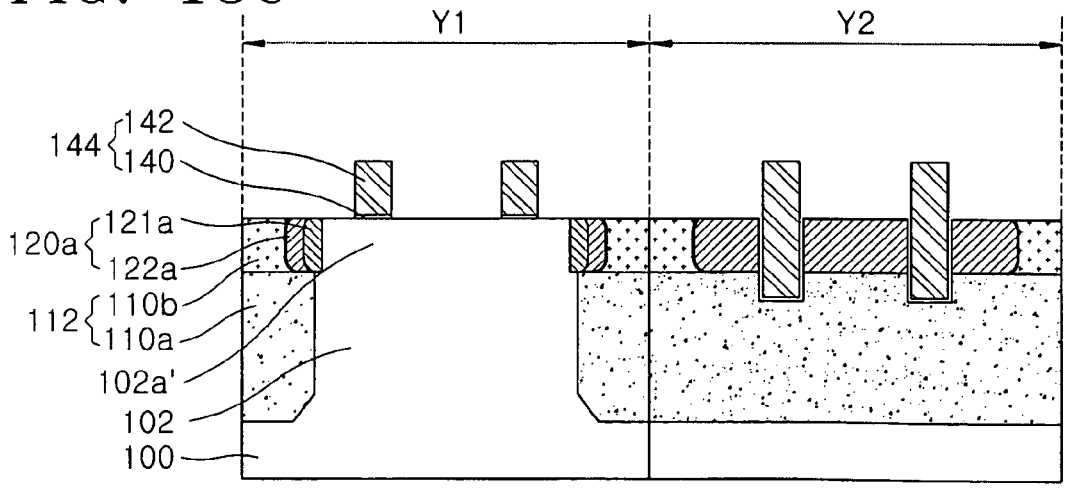

FIG. 13A illustrates a plan view of a structure after the gate electrode pattern 144 is formed on both sidewalls and the top surface of the channel region 102b'. FIG. 13B illustrates cross-sectional views taken along x-axial lines 13b(X1) and 13b(X2) shown in FIG. 13A. FIG. 13C illustrates cross-sectional views taken along y-axial lines 13c(Y1) and 13c(Y2) shown in FIG. 13A.

Referring to FIGS. 13A through 13C, the gate insulating layer 140 is formed on inner surfaces of the recess region 132 and a surface of the channel region 102b', which have undergone a planarization process. The gate insulating layer 140 may be formed using thermal oxidation and may be a thermal oxide layer or a high-k insulating layer, e.g., any one of an oxide layer, an ONO layer, and a high-k material layer. Thereafter, the gate conductive pattern 142 is deposited on an entire surface of the substrate 100 having the gate insulating layer 140 in the same manner as described with reference to FIGS. 11A through 11C, thereby forming the gate electrode pattern 144.

A semiconductor device according to an embodiment of the present invention offers the following several advantages.

First, as explained thus far, the junction in the semiconductor devices according to the embodiments of the present invention includes the protrusion and the SEG layer. Thus, since the area of the junction is extended by the area of the SEG layer, the electric resistance of the junction can be reduced.

Second, the SEG layer is formed on the first insulating layer so that leakage current flowing from the SEG layer to the substrate can be prevented.

Third, the first insulating layer disposed under the SEG layer can be used as an isolation layer. As a result, a gap filled region is extended to thereby minimize voids generated during formation of the isolation layer.

Fourth, because an interval between active regions can be minimized, integration density of semiconductor devices may be improved.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of fabricating a semiconductor device the method comprising:
    forming a protrusion that extends from a substrate, the protrusion being formed with an upper portion, a lower portion, a channel region, and a recess that extends through the upper portion and into the lower portion;
    forming a selective epitaxial growth (SEG) layer that surrounds the upper portion of the protrusion and has at least one gap that exposes a sidewall of the channel region of the protrusion, the recess of the protrusion being aligned with the gap, wherein:
    a width of a first section of the upper portion of the protrusion is less than a width of a first section of the lower portion of the protrusion, the first section of the upper portion of the protrusion corresponding to the recess and being directly above the first section of the lower portion of the protrusion.

2. The method as claimed in claim 1, further comprising:
    forming a first insulating layer on the substrate, the first insulating layer surrounding the protrusion;
    forming a recessed first insulating layer by recessing the first insulating layer to expose the upper portion of the protrusion;
    after forming the SEG layer, etching the SEG layer to form the at least one gap exposing a sidewall of the channel region of the protrusion, the at least one gap being formed at a location where a gate pattern will be formed; and
    forming the gate pattern on at least one exposed sidewall of the channel region.

3. The method as claimed in claim 2, wherein recessing the first insulating layer includes performing a time-controlled wet etching.

4. The method as claimed in claim 3, wherein recessing the first insulating layer includes using at least of diluted HF (DHF), NH$_4$F, and buffered oxide etchant (BOE), which is a mixture of HF and deionized water (DIW).

5. The method as claimed in claim 2, wherein the method further includes, before etching the SEG layer to form the at least one gap exposing a sidewall of the channel region:
  filling an isolation region including the SEG layer with a second insulating layer; and
  planarizing the second insulating layer until the second insulating layer forms a planar top surface with a top surface of a nitride pattern for a mask on the protrusion.

6. The method as claimed in claim 5, wherein the second insulating layer forms a planar bottom surface with a bottom surface of the SEG layer.

7. The method as claimed in claim 2, wherein etching the SEG layer to form the at least one gap exposing a sidewall of the channel region includes:
  forming a photoresist pattern defining a recess region where the gate pattern will be formed; and
  sequentially etching the second insulating layer, the SEG layer, and the recessed first insulating layer, which are exposed beyond both sidewalls of the protrusion, using the photoresist pattern as an etch mask.

8. The method as claimed in claim 7, wherein etching the recessed first insulating layer, the second insulating layer, and the SEG layer includes performing a dry etching.

9. The method as claimed in claim 2, further comprising controlling a threshold voltage by reducing a width of the channel region before forming the gate pattern, wherein:
  reducing the width of the channel region includes performing a time-controlled wet etching, and
  reducing the width of the channel region includes using the recessed first insulating layer as an etch stop layer.

10. The method as claimed in claim 1, wherein forming the SEG layer includes performing a molecular beam epitaxy (MBE).

11. The method as claimed in claim 1, wherein the SEG layer includes at least one of a silicon (Si) layer and a silicon germanium (SiGe) layer.

12. The method as claimed in claim 11, wherein:
the SEG layer includes at least the Si layer, and
forming the SEG layer includes forming the Si layer using a silicon (Si) source gas, the Si source gas including at least one of $SiH_4$ gas, $SiH_2Cl_2$ gas, $SiCl_4$ gas, and $Si_2H_6$ gas.

13. The method as claimed in claim 11, wherein:
the SEG layer includes at least the SiGe layer, and
forming the SEG layer includes forming the SiGe layer using a silicon (Si) source gas and a germanium (Ge) source gas, the Si source gas including at least one of $SiH_4$ gas, $SiH_2Cl_2$ gas, $SiCl_4$ gas, and $Si_2H_6$ gas.

14. The method as claimed in claim 1, wherein a width of the SEG layer increases in proportion to a time taken to form the SEG layer.

15. The method as claimed in claim 1, further comprising oxidizing a surface of the SEG layer using thermal oxidation.

16. The method as claimed in claim 1, further comprising controlling a threshold voltage by reducing a width of the channel region before forming a gate pattern on at least one sidewall of the channel region.

17. The method as claimed in claim 16, wherein reducing the width of the channel region includes performing a time-controlled wet etching.

18. The method as claimed in claim 17, wherein reducing the width of the channel region includes etching lateral surfaces of the channel region using a solution containing diluted HF (DHF) and $NH_4OH$.

\* \* \* \* \*